United States Patent [19]
Santo et al.

[11] Patent Number: 5,283,947
[45] Date of Patent: Feb. 8, 1994

[54] METHOD OF MOUNTING ELECTRONIC COMPONENTS ON A CIRCUIT BOARD

[75] Inventors: Kouichi Santo, Hirakata; Kouji Tanabe, Katano; Naohiro Nishioka, Yawata; Kenji Ootomo, Kadoma; Yoshihito Okazaki, Kyoto, all of Japan

[73] Assignee: Matsushita Electric Industrial Co., Inc., Kadoma, Japan

[21] Appl. No.: 16,082

[22] Filed: Feb. 10, 1993

[30] Foreign Application Priority Data

Feb. 10, 1992 [JP] Japan .................. 4-023515

[51] Int. Cl.⁵ .............................................. H05K 3/34
[52] U.S. Cl. .................................. 29/840; 29/832; 174/254
[58] Field of Search ............... 29/840, 825, 826, 830, 29/832; 228/179; 174/259; 361/398

[56] References Cited

U.S. PATENT DOCUMENTS

| | | | |
|---|---|---|---|
| 4,550,357 | 10/1985 | Matsumoto | 174/254 X |
| 4,631,820 | 12/1986 | Harada et al. | 29/840 |
| 4,667,401 | 5/1987 | Clements et al. | 29/840 X |
| 4,668,581 | 5/1987 | Lue et al. | 228/179 X |
| 4,795,079 | 1/1989 | Yamada | 228/179 |
| 4,950,527 | 8/1990 | Yamada | 361/398 X |

FOREIGN PATENT DOCUMENTS 63-262894 10/1988 Japan .
3-219691 9/1991 Japan .

*Primary Examiner*—Carl J. Arbes
*Attorney, Agent, or Firm*—Ratner & Prestia

[57] ABSTRACT

Anisotropic conductive material is employed instead of solder for connecting between the terminal of a component and a printed circuit board. In addition to the printed circuit board, a printed circuit sheet is provided and the terminal of the component is sandwiched between both anisotropic materials on the printed circuit board and beneath the printed circuit sheet. From both outside surfaces of the printed circuit board and the sheet, heat and pressure are simultaneously applied to the terminal part (i.e. thermocompression bonding).

2 Claims, 2 Drawing Sheets

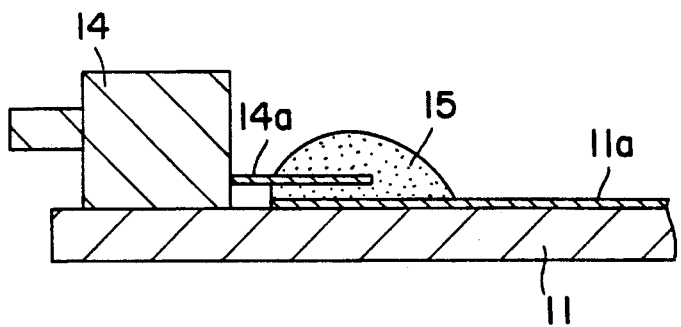
FIG. 1 (PRIOR ART)
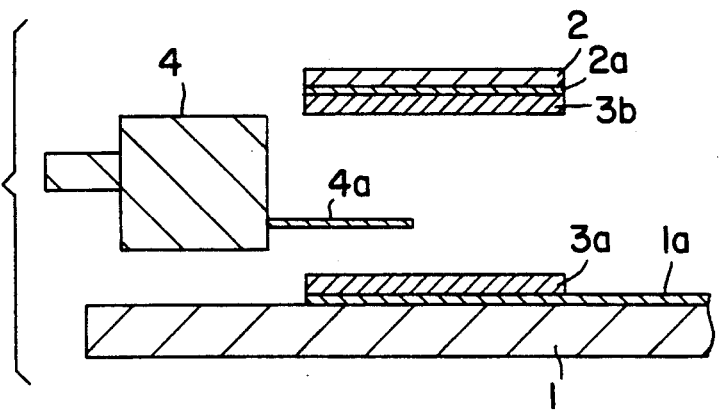
FIG. 2(a)
FIG. 2(b)
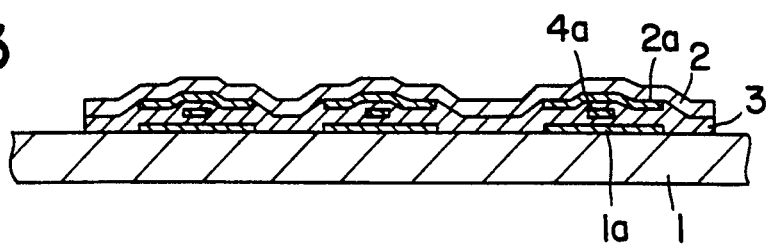
FIG. 3

METHOD OF MOUNTING ELECTRONIC COMPONENTS ON A CIRCUIT BOARD

BACKGROUND OF THE INVENTION (1) Field of the Invention

This invention relates to a method of mounting electronic components on circuit boards employed in electronic equipment such as video, audio, and office automation devices.

(2) Description of the Prior Art

Cost reduction of electronic equipment such as video, audio, and office automation devices is always desirable. One manner of reducing cost may be implemented at the manufacturing level. For example, at the manufacturing level, printed circuit boards are employed and electronic components are mounted on the printed circuit boards.

An exemplary method of mounting electronic components on printed circuit boards is explained below.

FIG. 1 shows a cross-sectional view of an electronic component which is mounted on a circuit board in accordance with the prior art. Before mounting an electronic component, solder 15 is printed on the conductive printed pattern 11a on the insulating board 11. The electronic component 14 is mounted on the board 11 so that the terminal 14a of the component 14 is fitted on the solder 15. Then, by heating the solder 15 to a sufficiently high temperature, the solder 15 melts. After cooling, the electronic component 14 is fixed to the circuit board 11 and the terminal 14a of the component 14 and the conductive printed pattern 11a are electrically connected by solder 15.

However, the above-mentioned mounting method has several problems:

(1) Even in the case which there are few components, a manufacturing process which includes the printing of solder 15 and the addition of heat to melt the solder 15 takes much time.

(2) To add sufficient heat for melting of the solder 15 (generally 220° to 280° degree C.) it is necessary for the material (such as an insulating board 11 and the component 14) to be able to withstand the heat. The use of such materials provides an added expense.

(3) In a low cost printed circuit board, when silver paste is generally used, a special solderable conductive material as a printed pattern 11a and the use of low melting solder are typically required.

SUMMARY OF THE INVENTION

An anisotropic conductive material is employed instead of solder for forming a connection between the terminal of the component and the printed circuit board. In addition to the printed circuit board, a printed circuit sheet is provided and the terminal of the component is sandwiched between anisotropic materials both on the printed circuit board and beneath the printed circuit sheet. From both outsides of the printed circuit board and sheet, heat and pressure are simultaneously applied to the terminal part, for example by thermocompression bonding.

BRIEF DESCRIPTION OF THE DRAWINGS

FIG. 1 is a cross-sectional view of an electronic component mounted on a circuit board in accordance with the prior art.

FIG. 2(a) is a cross-sectional view of an electronic component and a circuit board before mounting in accordance with an exemplary embodiment of the present invention.

FIG. 2(b) is a cross sectional view of an electronic component after mounting on a circuit board in accordance with an exemplary embodiment of the present invention.

FIG. 3 is a cross-sectional view of a terminal portion of FIG. 2(b) cut by the line 3—3 in accordance with an exemplary embodiment of the present invention.

DETAILED DESCRIPTION

Figure 4A:
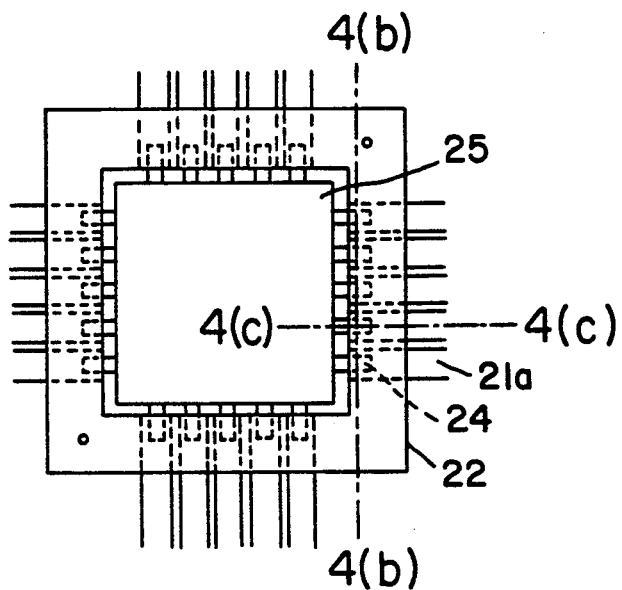
FIG. 4(a) is a top view of a multi-terminal component such as a flat-package IC mounted on a circuit board in accordance with a further exemplary embodiment of the present invention.

Refering now to the drawings, an exemplary embodiment of the present invention is explained in detail.

FIGS. 2(a) and (b) show cross-sectional views of the electronic component and the circuit board before and after mounting on the circuit board, respectively, in accordance with an exemplary embodiment of the present invention.

The lower wiring pattern 1a is printed on the lower insulating board 1. The upper wiring pattern 2a is printed beneath the upper insulating sheet 2 and facing towards the lower wiring pattern 1a. The lower anisotropic conductive material 3a is attached to the upper surface of the lower wiring pattern 1a and the upper anisotropic conductive material 3b is attached to the lower surface of the lower wiring pattern 2a. The terminal 4a of the electronic component 4 is between the portions of the upper and lower wiring patterns 2a and 1a respectively.

Anisotropic conductive material is generally formed by dispersing a conductive material such as carbon into a thermoplastic resin such as polyester and chloroprene and characteristically increasing the conductivity of the pressure direction by adding heat and pressure simultaneously. In the state shown in FIG. 2(a), heat and pressure are simultaneously added from outside of both the lower side of the lower insulating board 1 and outside of the upper side of the upper insulating sheet 2. Thus, both the upper and the lower anisotropic conductive materials 3b and 3a are pressed and heated as shown in FIG. 2(b). As a result, the terminal 4a of the electronic component 4 and the upper wiring pattern 2a become conductive through the upper anisotropic conductive material 3b and the terminal 4a and the lower wiring pattern 1a become conductive through the lower anisotropic conductive material 3a. Moreover, the upper and the lower wiring patterns 2a and 1a become conductive not through the terminal 4a but through the upper and lower anisotropic conductive materials 3b and 3a. Thus, a method of mounting electronic components on a printed circuit board can be offered with high quality.

FIG. 3 shows a cross sectional view of the terminal portion of FIG. 2(b) cut by the line 3—3. In particular, three electronic components are shown mounted on a printed circuit board.

EXAMPLE 1

Figure 4B:
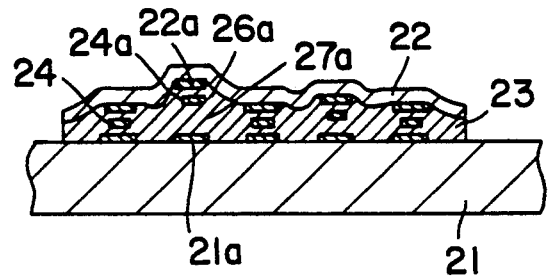
FIG. 4(b) is a cross-sectional view of the above example, FIG. 4(a) cut by the line 4(b)—4(b).
Figure 4C:
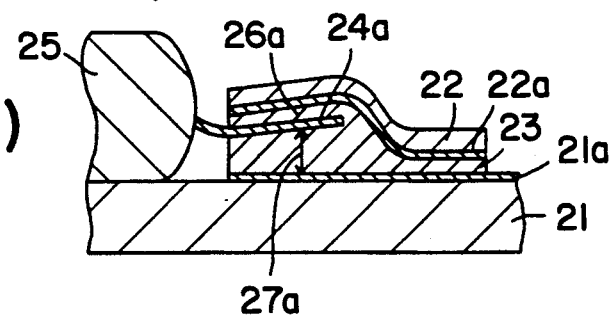
FIG. 4(c) is a partial, cross-sectional view of the above example, FIG. 4(a) cut by the line 4(c)—4(c).

FIGS. 4(a)–4(c) a further exemplary embodiment of the present invention.

FIG. 4(a) is a top view of a first example of a multi-terminal component, such as a flat-package IC, which is mounted on a printed circuit board in accordance with an exemplary embodiment of the present invention. FIG. 4(b) is a cross-sectional view of the same example, cut by the line 4(b)—4(b) in FIG. 4(a). FIG. 4(c) is a partial, cross-sectional view of the first example, cut by the line 4(c)—4(c) in FIG. 4(a).

As shown in FIG. 4(a), an electronic component with many terminals 24 (such as a flat-package IC) is mounted on the printed circuit board 21. As shown in FIG. 4(b) the distances between each terminal 24 of the electronic component 25 and the lower insulating board 21 are different from each other. There may also be a deformed terminal 24a. In this case, even if the distance 27a between the deformed terminal 24a and the wiring pattern 21a is longer than the other similar distance and the distance 27a has high resistance, as the terminal 24a becomes conductive with the upper wiring pattern 22a (through the anisotropic conductive material 26a) and the upper wiring pattern 22a becomes conductive with the lower wiring pattern 21a (through the anisotropic conductive material 23), the terminal 24a becomes conductive with the lower wiring pattern 21a. Thus a highly reliable mounting of the component on the printed board can be achieved.

EXAMPLE 2

Figure 5:
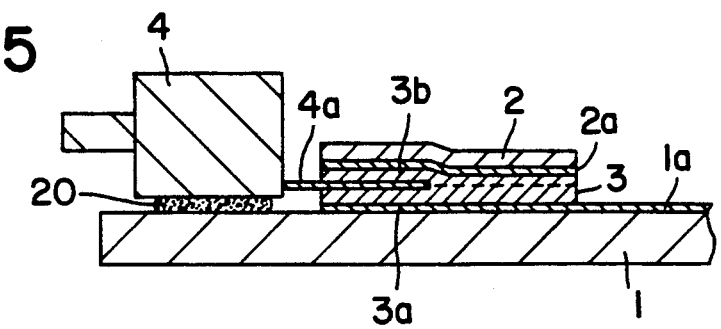
FIG. 5 is a cross-sectional view of the electronic component mounted on the circuit board in accordance with a still further exemplary embodiment of the present invention.

FIG. 5 shows a cross-sectional view of an electronic component mounted on a circuit board in accordance with a second exemplary embodiment of the present invention. The second exemplary embodiment of the present invention differs from the first exemplary embodiment in that, in the second exemplary embodiment, an electronic component 4 is bonded to the lower insulating board 1 by an adhesive 20. By this means the electronic component 4 can be firmly fixed to the lower insulating board 1 by the adhesive 20 and the reliability of the electrical connection between the terminal 4a and the upper and the lower anisotropic materials 3b and 3a can be increased.

According to the present invention, it is unnecessary to print solder on the printed circuit board and to expose the product in a high temperature atmosphere. Furthermore, in accordance with the present invention, the terminals of the electronic component are electrically connected to the upper and the lower wiring patterns through anisotropic materials by thermocompression bonding. In addition, the upper wiring pattern and the lower wiring pattern are electrically connected to each other through anisotropic materials without requiring a connection through the terminal of the component. Thus a highly reliable mounting method of electronic components on printed circuit boards can be offered.

An advantage of this invention is that the manufacturing process of printing solder and applying heat for the whole product is unnecessary and an insulating material which withstands a temperature of, for example 150 to 200 degree C., can be employed. Also, cheaper insulating material can be employed and partial heating is sufficient. Furthermore, the manufacturing cost is reduced by reducing mounting time of components on printed circuit boards.

In addition, the reliability of electrical connections between the terminal of the components and the wiring patterns on the printed circuit boards is improved.

Any kind of electronic or electric components may be used as long as they have terminals to which thermocompression bonding can be applied. The insulating board may be an insulating sheet.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within are intended to be embraced therein.

What is claimed is:

1. A method of mounting an electronic component on a printed circuit board, comprising the steps of:

attaching anisotropic conductive material to a lower wiring pattern which is printed on a lower insulating board or sheet;

attaching anisotropic conductive material beneath an upper wiring pattern which is printed beneath an upper insulating sheet or board;

sandwiching terminals of said electronic component between a) said anisotropic conductive material on said lower wiring pattern printed on said lower insulating board or sheet and b) said anisotropic conductive material beneath said upper wiring pattern printed beneath said upper insulating sheet or board; and bonding by thermocompression from both outside surfaces of said lower insulating board or sheet and said upper insulating sheet or board.

2. A method of mounting an electronic component on a printed circuit board as recited in claim 1 wherein said electronic component is previously bonded by adhesive on said lower printed circuit board.

* * * * *